(12) United States Patent
Oh

(10) Patent No.: US 11,107,933 B2
(45) Date of Patent: Aug. 31, 2021

(54) TWO-TERMINAL DEVICE AND LIGHTING DEVICE USING THE SAME

(71) Applicant: Teresa Oh, Cheongju-si (KR)

(72) Inventor: Teresa Oh, Cheongju-si (KR)

(*) Notice: Subject to any disclaimer, the term of this patent is extended or adjusted under 35 U.S.C. 154(b) by 0 days.

(21) Appl. No.: 16/619,843

(22) PCT Filed: Mar. 6, 2019

(86) PCT No.: PCT/KR2019/002601
§ 371 (c)(1),
(2) Date: Dec. 5, 2019

(87) PCT Pub. No.: WO2019/172648
PCT Pub. Date: Sep. 12, 2019

(65) Prior Publication Data
US 2020/0395490 A1    Dec. 17, 2020

Related U.S. Application Data

(63) Continuation-in-part of application No. 15/913,036, filed on Mar. 6, 2018, now abandoned.

(51) Int. Cl.
| | |
|---|---|
| *H01L 29/86* | (2006.01) |
| *H01L 29/41* | (2006.01) |
| *H01L 29/72* | (2006.01) |
| *H01L 29/74* | (2006.01) |
| *H01L 29/00* | (2006.01) |

(Continued)

(52) U.S. Cl.
CPC ............ *H01L 29/86* (2013.01); *H01L 29/417* (2013.01); *H01L 29/72* (2013.01); *H05B 45/30* (2020.01); *H01L 27/01* (2013.01); *H01L 27/224* (2013.01); *H01L 27/2409* (2013.01); *H01L 28/00* (2013.01); *H01L 29/00* (2013.01); *H01L 29/51* (2013.01); *H01L 29/74* (2013.01); *H01L 51/0575* (2013.01)

(58) Field of Classification Search
CPC ....... H01L 29/86; H01L 29/417; H01L 29/72; H01L 29/74; H01L 29/00; H01L 27/2409; H01L 27/224; H01L 27/01; H01L 28/00; H01L 51/0575

See application file for complete search history.

(56) References Cited

U.S. PATENT DOCUMENTS 3,735,156 A * 5/1973 Krambeck ........ H01L 29/42396
                                                  327/581
3,896,484 A * 7/1975 Nishizawa .......... H01L 29/1062
                                                  257/215

(Continued)

FOREIGN PATENT DOCUMENTS

| KR | 1987-0001677 | 3/1987 |
|---|---|---|
| KR | 10-0897605 | 5/2009 |

(Continued)

OTHER PUBLICATIONS

The International Search Report corresponding to International Application No. PCT/KR2019/002601 dated Jul. 8, 2019.

*Primary Examiner* — Ida M Soward

(74) *Attorney, Agent, or Firm* — Kile Park Reed & Houtteman PLLC

(57) ABSTRACT

A two-terminal device (TTD) capable of preventing leakage current by using diffusion current having bidirectionality and generated due to a potential barrier by an insulator, and a lighting device using the TTD are disclosed.

19 Claims, 14 Drawing Sheets

(51) Int. Cl.
*H01L 27/24* (2006.01)
*H01L 27/22* (2006.01)
*H01L 27/01* (2006.01)
*H01L 51/05* (2006.01)
*H01L 29/417* (2006.01)
*H05B 45/30* (2020.01)
*H01L 29/51* (2006.01)
*H01L 49/02* (2006.01)

(56) References Cited

U.S. PATENT DOCUMENTS

| | | | | |
|---|---|---|---|---|
| 3,913,122 | A * | 10/1975 | Borel | H01L 29/76875 |
| | | | | 257/248 |
| 8,487,356 | B2 * | 7/2013 | Heo | H01L 29/78645 |
| | | | | 257/288 |
| 8,895,930 | B2 * | 11/2014 | Ouvrier-Buffet | G01J 5/0803 |
| | | | | 250/349 |
| 9,196,679 | B2 * | 11/2015 | Edwards | H01L 29/66204 |
| 9,224,828 | B2 * | 12/2015 | Edwards | H01L 29/0692 |
| 9,685,502 | B2 * | 6/2017 | Wood | H01L 27/0623 |
| 2008/0296049 | A1 * | 12/2008 | Honjo | H05K 1/0218 |
| | | | | 174/254 |
| 2010/0096078 | A1 * | 4/2010 | Nakamura | H05K 3/46 |
| | | | | 156/247 |
| 2011/0104889 | A1 * | 5/2011 | Lee | H01L 21/76831 |
| | | | | 438/637 |
| 2015/0137134 | A1 * | 5/2015 | Shah | H01L 29/8083 |
| | | | | 257/76 |
| 2019/0140046 | A1 * | 5/2019 | Liu | H01L 29/1608 |

FOREIGN PATENT DOCUMENTS

| | | |
|---|---|---|
| KR | 10-1117739 | 2/2012 |
| KR | 10-2015-0078155 | 7/2015 |
| KR | 10-2016-0101350 | 8/2016 |

* cited by examiner

TWO-TERMINAL DEVICE AND LIGHTING DEVICE USING THE SAME

TECHNICAL FIELD

Various embodiments generally relate to a two-terminal device (hereinafter referred to as "TTD") and a lighting device using the same, and more particularly, to a TTD capable of preventing leakage current by using diffusion current having bidirectionality and generated due to a potential barrier by an insulator, and a lighting device using the TTD.

BACKGROUND ART

An electric car may be exemplified as a typical case in which various electronic parts are combined.

The electric car market is getting bigger recently. In an electric car, the lifetime of a battery is an important management factor. The lifetime of a battery is closely related with a charging method and a discharge phenomenon, and may be extended by eliminating leakage current.

In view of the above, a leakage current cutoff sensor is used as an essential component for cutting off leakage current.

Even though such a leakage current cutoff sensor is used, problems such as reduction in the lifetime of an electronic part, spark generation, overheating of an LED lamp, overdischarge of a battery or a short circuit are caused due to electrical instability in a device (an application) in which various electronic parts are combined.

In general, in the case where leakage current is cut off to protect electronic parts, a circuit protector or a voltage controller may be used in the electronic parts. The circuit protector and the voltage controller may be configured to use a zener diode, and are configured to cut off leakage current by the zener diode when a voltage drops below a preset voltage.

However, if leakage current is originally prevented, the aforementioned problems caused by the leakage current may be solved naturally. That is to say, problems such as spark generation and overheating may be solved by fundamental prevention of leakage current.

In addition, due to the development of semiconductor technology, the size of a semiconductor device is gradually decreasing. However, the size reduction of a semiconductor device is accompanied by secondary problems associated with an SiO2 thin film insulator, due to limitations in silicon semiconductor technology. Moreover, leakage current causes serious problems in applications such as various electronic sensors, displays, smart phones, batteries and lighting devices using semiconductor devices.

Meanwhile, an LED may be used in applications such as displays including large area displays and mobile displays or lighting devices, as light sources or backlight units.

However, the LED generates a lot of heat because of an accompanying resistance component. The heat generation serves as a factor that degrades the lifetime and luminous efficiency of the LED. Therefore, a lighting device having an LED requires adoption of a technology for solving heat generation.

Also, in the case where an LED having a DC operation characteristic is used in a lighting device of high power, the lighting device needs an additional configuration for driving the LED using a commercial AC power source.

DISCLOSURE

Technical Problem

Various embodiments are directed to a TTD capable of preventing leakage current by using diffusion current having bidirectionality and generated due to a potential barrier by an insulator.

Also, various embodiments are directed to a lighting device using the TTD.

Further, various embodiments are directed to a TTD having a structure capable of efficiently dissipating heat generated in a lighting device, and a lighting device using the TTD.

Moreover, various embodiments are directed to a lighting device capable of driving an LED by using commercial AC power in the case where an LED having a DC characteristic is used in a lighting device of high power.

Technical Solution

In an embodiment, a two-terminal device includes: a first terminal; a second terminal; and a diffusion current element including an insulating layer, and configured to prevent generation of leakage current by generating diffusion current due to a potential barrier of the insulating layer depending on voltage environment between the first terminal and the second terminal, the diffusion current element including the insulating layer; a first electrode corresponding to the first terminal, and formed on the insulating layer; a second electrode corresponding to the second terminal, and formed on the insulating layer to be separated from the first electrode; and diffusion electrodes separated from one another and arranged in a line on the insulating layer between the first electrode and the second electrode, and configured to form multiple channels for transferring the diffusion current, wherein each of the multiple channels amplifies the diffusion current having directionality depending on the voltage environment.

In an embodiment, a two-terminal device may include: a first terminal; a second terminal; and a diffusion current element including an insulating layer, and configured to prevent generation of leakage current by generating diffusion current due to a potential barrier of the insulating layer depending on voltage environment between the first terminal and the second terminal, the diffusion current element including the insulating layer; a first electrode corresponding to the first terminal, and formed on the insulating layer; a second electrode corresponding to the second terminal, and formed on the insulating layer to be separated from the first electrode; diffusion electrodes separated from one another and arranged in a line on the insulating layer between the first electrode and the second electrode, and configured to form multiple channels for transferring the diffusion current; and a control electrode formed with respect to the insulating layer, wherein the control electrode is electrically connected to at least one of the first electrode and the second electrode, and wherein each of the multiple channels amplifies the diffusion current having directionality depending on the voltage environment.

In an embodiment, a lighting device may include: a two-terminal device having a first terminal and a second terminal; an LED module; and a power source, wherein the LED module and the power source are connected in series between the first terminal and the second terminal, wherein the two-terminal device includes the first terminal; the second terminal; and a diffusion current element including an insulating layer, and configured to prevent generation of leakage current by generating diffusion current due to a potential barrier of the insulating layer depending on voltage environment between the first terminal and the second terminal, wherein the diffusion current element includes the insulating layer; a first electrode corresponding to the first terminal, and formed on the insulating layer; a second electrode corresponding to the second terminal, and formed on the insulating layer to be separated from the first electrode; and diffusion electrodes separated from one another and arranged in a line on the insulating layer between the first electrode and the second electrode, and configured to form multiple channels for transferring the diffusion current, and wherein each of the multiple channels amplifies the diffusion current having directionality depending on the voltage environment.

In an embodiment, a lighting device may include: a two-terminal device having a first terminal and a second terminal; an LED module; and a power source, wherein the LED module and the power source are connected in series between the first terminal and the second terminal, wherein the two-terminal device includes the first terminal; the second terminal; and a diffusion current element including an insulating layer, and configured to prevent generation of leakage current by generating diffusion current due to a potential barrier of the insulating layer depending on voltage environment between the first terminal and the second terminal, wherein the diffusion current element includes the insulating layer; a first electrode corresponding to the first terminal, and formed on the insulating layer; a second electrode corresponding to the second terminal, and formed on the insulating layer to be separated from the first electrode; diffusion electrodes separated from one another and arranged in a line on the insulating layer between the first electrode and the second electrode, and configured to form multiple channels for transferring the diffusion current; and a control electrode formed with respect to the insulating layer, wherein the control electrode is electrically connected to at least one of the first electrode and the second electrode, and wherein each of the multiple channels amplifies the diffusion current having directionality depending on the voltage environment.

In an embodiment, a lighting device may include: a two-terminal device having a first terminal and a second terminal; an LED module; and a power source, wherein the LED module and the power source are connected in series between the first terminal and the second terminal, wherein the two-terminal device includes the first terminal; the second terminal; a first diffusion current element including a first insulating layer, a first electrode, first diffusion electrodes and a second electrode which are arranged in a line on the first insulating layer, and a first control electrode which is electrically connected to the first electrode and is formed with respect to the first insulating layer, the first electrode corresponding to the first terminal, the first diffusion electrodes being configured to form multiple channels which are arranged in a line, the first diffusion current element being configured to prevent generation of leakage current by generating diffusion current due to a potential barrier of the first insulating layer; and a second diffusion current element including a second insulating layer, a third electrode, second diffusion electrodes and a fourth electrode which are arranged in a line on the second insulating layer, and a second control electrode which is electrically connected to the fourth electrode and is formed with respect to the second insulating layer, the fourth electrode corresponding to the second terminal, the second diffusion electrodes being configured to form multiple channels which are arranged in a line, the second diffusion current element being configured to prevent generation of leakage current by generating diffusion current due to a potential barrier of the second insulating layer, wherein the second electrode of the first diffusion current element and the third electrode of the second diffusion current element are electrically connected, and wherein, in each of the first diffusion current element and the second diffusion current element, each of the multiple channels amplifies the diffusion current having directionality depending on voltage environment between the first terminal and the second terminal.

Advantageous Effects

The TTD according to the embodiments of the present disclosure may prevent leakage current by using diffusion current having bidirectionality and generated due to a potential barrier by an insulator.

Also, the lighting device according to the embodiments of the present disclosure may solve problems caused due to leakage current, by using the TTD. In particular, the lighting device according to the embodiments of the present disclosure may prevent heat generation in the lighting device, by preventing leakage current in the TTD.

Further, the TTD and the lighting device according to the embodiments of the present disclosure may achieve efficient heat dissipation of the TTD by coupling a heat dissipation plate for dissipating heat generated in the TTD, to the TTD.

Moreover, the lighting device according to the embodiments of the present disclosure may control heat generation of the lighting device at a TTD level by configuring the TTD for AC power supplied to a power conversion device, in the case where an LED having a DC characteristic is driven by using high power.

MODE FOR DISCLOSURE

Figure 1:
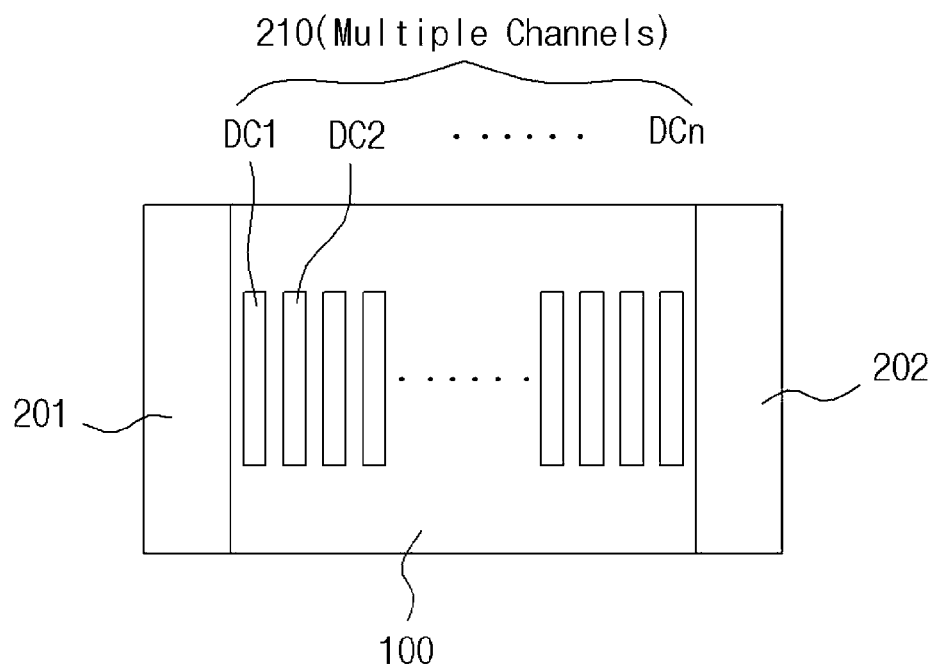
FIG. 1 is a top view illustrating a diffusion current element to be applied to a TTD in accordance with an embodiment of the present disclosure.

Exemplary embodiments will be described below in more detail with reference to the accompanying drawings. The disclosure may, however, be embodied in different forms and should not be construed as limited to the embodiments set forth herein. Rather, these embodiments are provided so that this disclosure will be thorough and complete, and will fully convey the scope of the disclosure to those skilled in the art. Throughout the disclosure, like reference numerals refer to like parts throughout the various figures and embodiments of the disclosure.

The present disclosure discloses a TTD which has two terminals and prevents leakage current. The TTD of the present disclosure includes a first terminal, a second terminal and a diffusion current element. The TTD of the present disclosure has a two-terminal structure including the first terminal and the second terminal. In the TTD, the first terminal corresponds to TD1 of FIG. 18 which will be exemplarily described later, and the second terminal corresponds to TD2 of FIG. 18 which will be exemplarily described later.

An embodiment of the TTD of the present disclosure may be understood as a leakage current cutoff sensor device which uses a diffusion current element. The diffusion current element included in the TTD of the present disclosure is configured to serve as a bidirectional transistor. The diffusion current element may generate diffusion current due to a potential barrier of a thin insulating layer having negative potential, to solve problems caused by leakage current.

That is to say, the diffusion current element includes an insulating layer, and prevents generation of leakage current by generating diffusion current due to a potential barrier of the insulating layer depending on the voltage environment between the first terminal and the second terminal of the TTD. The fact that the diffusion current element serves as a bidirectional transistor means that diffusion current may flow in one of a first terminal direction and a second terminal direction depending on the voltage environment between the first terminal and the second terminal of the TTD.

A typical transistor has a structure in which a drain terminal and a source terminal are separated by a gate and a gate insulating layer, and a channel is formed between the source terminal and the drain terminal. In addition, a change in an amount of current flowing through the transistor may be mainly controlled by the channel. In such a transistor, the source terminal and the drain terminal cannot be arranged to have a serial or parallel connection.

Diffusion current is generated by spontaneous polarization due to a potential barrier generated by an amorphous insulating layer or a depletion layer. An insulating layer (a dielectric) exhibits spontaneous polarization corresponding to a potential barrier. In most cases, an insulating layer may be formed of an SiOC (carbon doped silicon oxide) material.

Diffusion current due to spontaneous polarization of a dielectric acts in a direction opposite to drift current, and accordingly, a potential difference in an insulating layer may be reduced by the diffusion current. Therefore, in the case where an SiOC insulating layer is disposed at a metal/semiconductor interface where resistance due to metal contact may increase, a potential barrier by the insulating layer generates diffusion current acting in a direction opposite to drift current, due to spontaneous polarization of a dielectric having a low dielectric constant. Thus, by suppressing an increase in resistance due to metal contact, the flow of a large amount of current is allowed through the metal contact. According to this fact, leakage current may be prevented by diffusion current.

In the diffusion current element, the directionality of diffusion current is determined by voltage environment applied to the insulating layer. The TTD of the present disclosure generates diffusion current of which the directionality is determined by the voltage environment between the first terminal and the second terminal. In other words, the diffusion current element included in the TTD generates diffusion current which has directionality that depends on the voltage environment between a first electrode and a second electrode corresponding to the first terminal and the second terminal, that is, the voltage environment that is applied to the insulating layer.

In the diffusion current element which prevents leakage current and has a bidirectional transfer characteristic as described above, as the contact resistance of the interface is minimized, current efficiency may be increased and a larger amount of diffusion current may flow.

The diffusion current element may be described with reference to FIGS. 1 to 13, and the TTD of the present disclosure, which includes a diffusion current element, may be described with reference to FIGS. 14 to 31.

Figure 2:
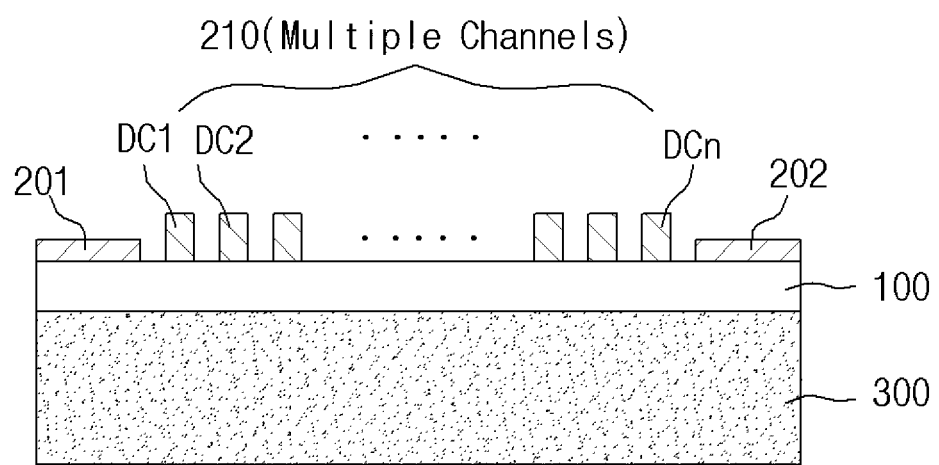
FIG. 2 is a cross-sectional view of the diffusion current element of FIG. 1.
Figure 3:
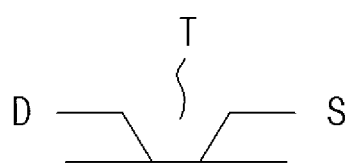
FIG. 3 is a diagram illustrating a symbol for representing the diffusion current element of FIG. 1.

First, FIG. 1 is a top view illustrating a diffusion current element to be applied to a TTD in accordance with an embodiment of the present disclosure, FIG. 2 is a cross-sectional view of the diffusion current element of FIG. 1, and FIG. 3 is a diagram illustrating a symbol for representing the diffusion current element of FIG. 1.

The diffusion current element of FIGS. 1 and 2 includes an insulating layer 100 on a substrate 300, a first electrode 201 which corresponds to a first terminal TD1 of a TTD and is formed on the insulating layer 100, a second electrode 202 which corresponds to a second terminal TD2 of the TTD and is formed on the insulating layer 100 to be separated from the first electrode 201, and diffusion electrodes 210 which are separated from one another and are arranged in a line on the insulating layer 100 between the first electrode 201 and the second electrode 202 and form multiple channels for transferring diffusion current.

The diffusion current element which is embodied as illustrated in FIGS. 1 and 2 and serves as a bidirectional transistor by having a bidirectional transfer characteristic for diffusion current may be represented as a symbol illustrated in FIG. 3. In FIG. 3, it may be understood that T denotes the diffusion current element, D corresponds to the first electrode 201 of FIGS. 1 and 2 and S corresponds to the second electrode 202 of FIGS. 1 and 2.

The diffusion current element of FIGS. 1 and 2 is embodied to serve as a bidirectional transistor but to have no control electrode.

The insulating layer 100 of FIGS. 1 and 2 may be formed as an SiOC thin film.

For the sake of convenience in explanation, the entire diffusion electrodes are denoted by 210, and N (N is a natural number) number of diffusion electrodes are denoted by DC1 to DCn, respectively.

In the configuration mentioned above, the first electrode 201, the diffusion electrodes 210 and the second electrode 202 may be formed of a conductive material, for example, metal wire. The first electrode 201, the diffusion electrodes 210 and the second electrode 202 are formed to have patterns which are arranged in a line on the insulating layer 100 and are separated from one another by a predetermined distance.

Figure 4:
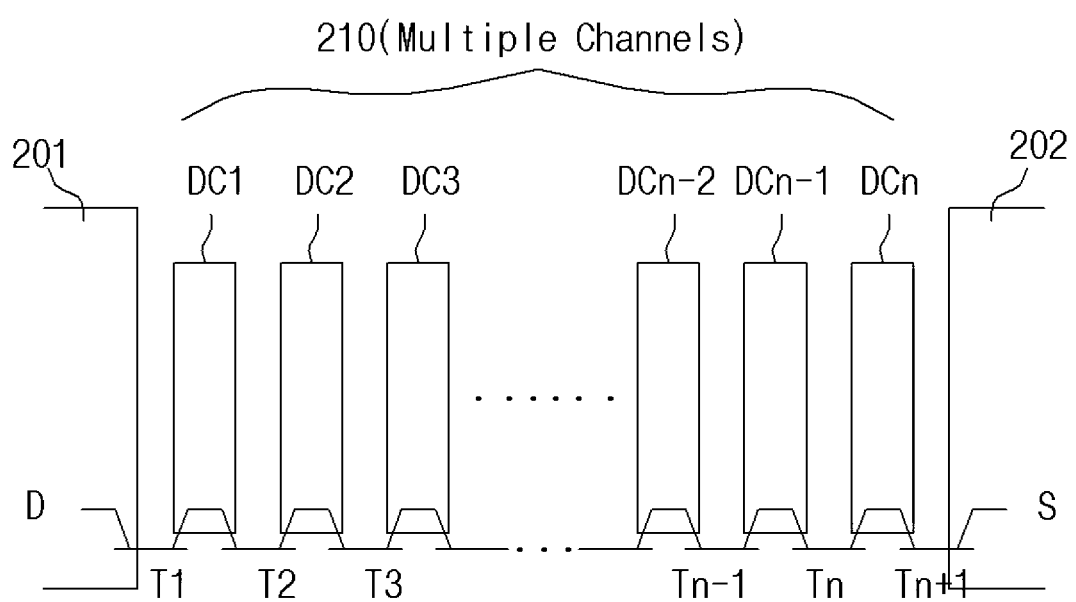
FIG. 4 is a partial enlarged top view of the diffusion current element of FIG. 1 to which an equivalent circuit is applied.

The first electrode 201, the diffusion electrodes 210 and the second electrode 202 generate, amplify and transfer diffusion current corresponding to a potential barrier of the insulating layer 100 at each channel of the multiple channels of the diffusion electrodes 210. The generation, amplification and transfer of diffusion current per channel may be described below with reference to FIG. 4. FIG. 4 is a partial enlarged top view of the diffusion current element of FIG. 1 to which an equivalent circuit is applied.

Referring to FIG. 4, the multiple channels formed by the diffusion electrodes 210 include a channel between the first electrode 201 and the diffusion electrode DC1 closest thereto, channels between the diffusion electrodes DC1 to DCn and a channel between the second electrode 202 and the diffusion electrode DCn closest thereto. Each channel between adjacent electrodes may be equivalently expressed as a unit diffusion current element which generates, amplifies and transfers diffusion current by an underlying insulating layer. Therefore, the multiple channels of the diffusion electrodes DC1 to DCn which are arranged in a line may be expressed as an equivalent circuit in which unit diffusion current elements T1 to Tn+1 are connected in series.

In FIG. 4, a direction of diffusion current is determined by the voltage environment between the first electrode 201 and the second electrode 202. Thus, diffusion current is generated in a direction opposite to drift current, due to a potential barrier of the insulating layer at the unit diffusion current elements T1 to Tn+1 of the respective channels, in a direction determined by the voltage environment. Diffusion current may be transferred while being amplified stepwise through the multiple channels of the diffusion electrodes 210.

An amplification degree of diffusion current per channel may be determined by a separation distance between electrodes and the characteristic of the insulating layer.

The embodiment of the diffusion current element described with reference to FIGS. 1 to 4 has a structure in which the first electrode 201 and the second electrode 202 are stacked on the insulating layer 100, unlike a typical transistor having a channel layer.

The insulating layer 100 is formed as an SiOC thin film as described above, and has a dielectric constant within a range of approximately 0.5 to 2.5. For an electronic sensor which is manufactured using a transistor having high sensitivity, the insulating layer 100 may have leakage current within a range of $10^{-14}$ A to $10^{-1}$ A, and may be required to be formed to be amorphous instead of exhibiting polarization.

The insulating layer 100 used in configuring the diffusion current element may be formed by heat treatment for the SiOC thin film, and may be formed by a process in which SiOC is deposited by sputtering, ICP (inductively coupled plasma)-CVD (chemical vapor deposition) or PECVD (plasma-enhanced chemical vapor deposition).

In order to reduce the polarization of the SiOC thin film, that is, in order to suppress the increase in polarization due to carbon and oxygen, a carbon content of an SiOC target used for deposition may be controlled. In the case where a carbon content of an SiOC target is 0.1 wt % or less, it is difficult to form the SiOC thin film. Therefore, in order to limit a dielectric constant of the insulating layer 100 within a range of 0.5 to 2.5, it is appropriate that a carbon content of an SiOC target is within a range of 0.05 wt % to 15 wt %.

Figure 5:
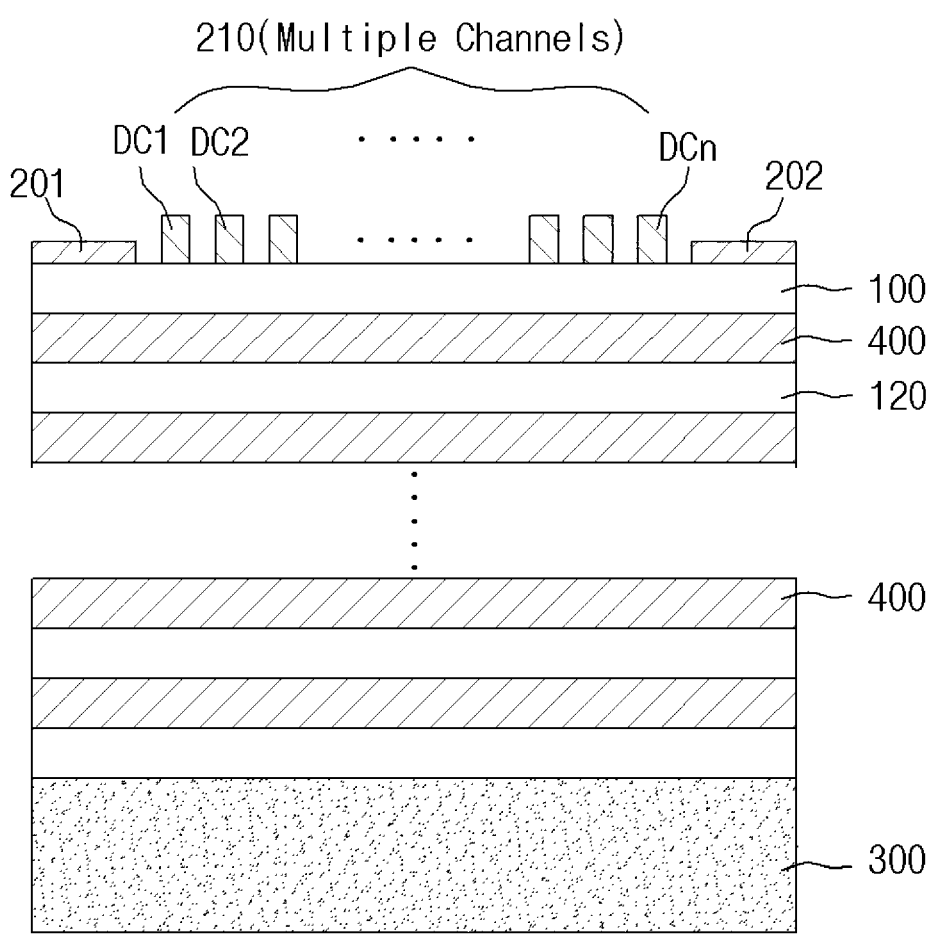
FIG. 5 is a cross-sectional view illustrating a modified embodiment of FIG. 2.

Meanwhile, the diffusion current element of the present disclosure may be embodied by being modified as illustrated in FIG. 5. In FIG. 5, since the structure of the first electrode 201, the second electrode 202 and the diffusion electrodes 210 on the insulating layer 100 is the same as in the embodiment of FIGS. 1 and 2, repeated descriptions therefor will be omitted herein.

Referring to FIG. 5, in order to improve a diffusion current transfer characteristic, the diffusion current element may have a structure in which an interlayer conductive layer 400 and an interlayer insulating layer 120 are additionally stacked by one layer or a plurality of layers between the insulating layer 100 and the substrate 300. The interlayer conductive layer 400 may be formed under the insulating layer 100, and the interlayer insulating layer 120 may be formed under the interlayer conductive layer 400. The interlayer conductive layer 400 and the interlayer insulating layer 120 may be alternately stacked by at least one layer.

The interlayer conductive layer 400 may be formed of one selected among aluminum (Al), nanowire, graphene, ITO (indium tin oxide), TCO (transparent conductive oxide), AZO (aluminum zinc oxide), ZTO (zinc tin oxide), IGZO (indium gallium zinc oxide), ZITO (Sn codoped indium oxide), SiZO (silicon indium zinc oxide), hybrid (composite) and CNT-based transparent electrode.

Meanwhile, the diffusion current element of the present disclosure may be embodied to have a control electrode. Embodiments for this may be illustrated as the cross-sectional views of FIGS. 6 to 8. The embodiments of FIGS. 6 to 8 may be represented as a symbol illustrated in FIG. 9, and amplification and transfer of diffusion current per channel may be described with reference to FIG. 10.

Figure 6:
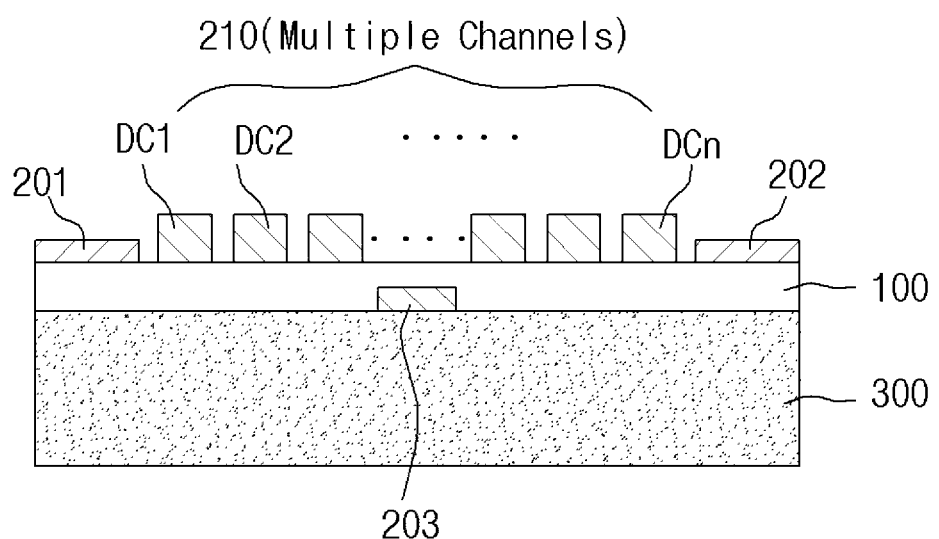
FIG. 6 is a cross-sectional view illustrating a diffusion current element to be applied to a TTD in accordance with another embodiment of the present disclosure.
Figure 7:
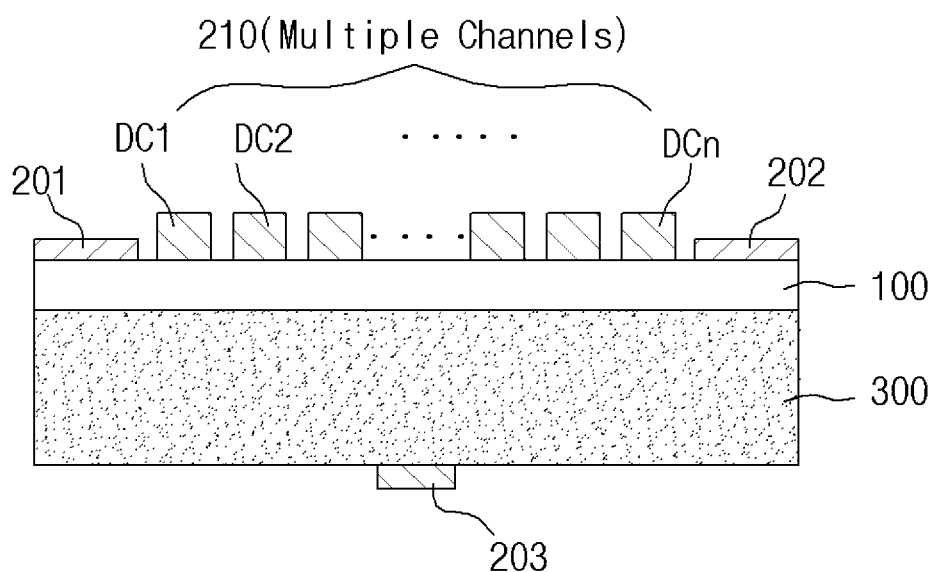
FIG. 7 is a cross-sectional view illustrating a diffusion current element to be applied to a TTD in accordance with still another embodiment of the present disclosure.
Figure 8:
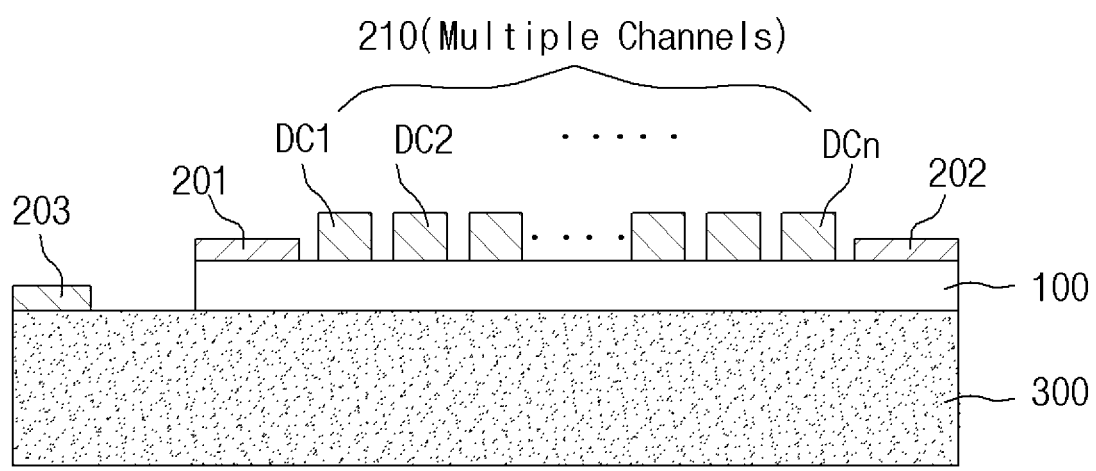
FIG. 8 is a cross-sectional view illustrating a diffusion current element to be applied to a TTD in accordance with yet another embodiment of the present disclosure.

Each of diffusion current elements embodied in FIGS. 6 to 8 includes an insulating layer 100 on a substrate 300, a first electrode 201 which corresponds to a first terminal TD1 of a TTD and is formed on the insulating layer 100, a second electrode 202 which corresponds to a second terminal TD2 of the TTD and is formed on the insulating layer 100 to be separated from the first electrode 201, diffusion electrodes 210 which are separated from one another and are arranged in a line on the insulating layer 100 between the first electrode 201 and the second electrode 202 and form multiple channels for transferring diffusion current, and a control electrode 203 which is formed with respect to the insulating layer 100.

The control electrode 203 is electrically connected to at least one of the first electrode 201 and the second electrode 202.

Each of the multiple channels of the diffusion electrodes 210 amplifies diffusion current which has directionality depending on voltage environment.

The embodiments of the diffusion current elements of FIGS. 6 to 8 are different from the embodiment of FIGS. 1 and 2 in that they further include the control electrode 203. Therefore, repeated descriptions for the same configuration and function of the embodiments of the diffusion current elements of FIGS. 6 to 8 as the embodiment of FIGS. 1 and 2 will be omitted herein.

In the embodiments of FIGS. 6 to 8, the control electrode 203 is configured at different positions. In the case of the embodiment of FIG. 6, the control electrode 203 of the diffusion current element is illustrated as being formed on the bottom surface of the insulating layer 100 to extend into the insulating layer 100. In the case of the embodiment of FIG. 7, the control electrode 203 of the diffusion current element is illustrated as being formed on the bottom surface of the substrate 300 lying under the insulating layer 100. In the case of the embodiment of FIG. 8, the control electrode 203 of the diffusion current element is illustrated as being formed on the insulating layer 100 at a position separated from the first electrode 201, the diffusion electrodes 210 and the second electrode 202. In detail, the control electrode 203 of FIG. 8 is illustrated as being formed at an edge of the insulating layer 100.

Even in the embodiments of FIGS. 6 to 8, in the same manner as in the embodiment of FIGS. 1 and 2, the insulating layer 100 is formed as an SiOC thin film, has, if possible, a dielectric constant within a range of 0.5 to 2.5 and leakage current within a range of $10^{-14}$ A to $10^{-1}$ A, and is required to be formed to be amorphous instead of exhibiting polarization.

Figure 9:
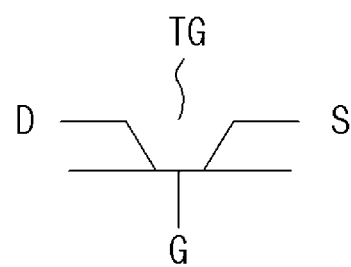
FIG. 9 is a diagram illustrating a symbol for representing the embodiments of FIGS. 6 to 8.

The diffusion current elements of FIGS. 6 to 8 may be represented as a symbol illustrated in FIG. 9. In FIG. 9, it may be understood that TG represents the diffusion current element having the control electrode 203, D corresponds to the first electrode 201 of FIGS. 6 to 8, S corresponds to the second electrode 202 of FIGS. 6 to 8, and G corresponds to the control electrode 203 of FIGS. 6 to 8.

In the configuration mentioned above, the control electrode 203 may be formed of a conductive material, for example, metal wire, like the first electrode 201, the diffusion electrodes 210 and the second electrode 202.

Figure 10:
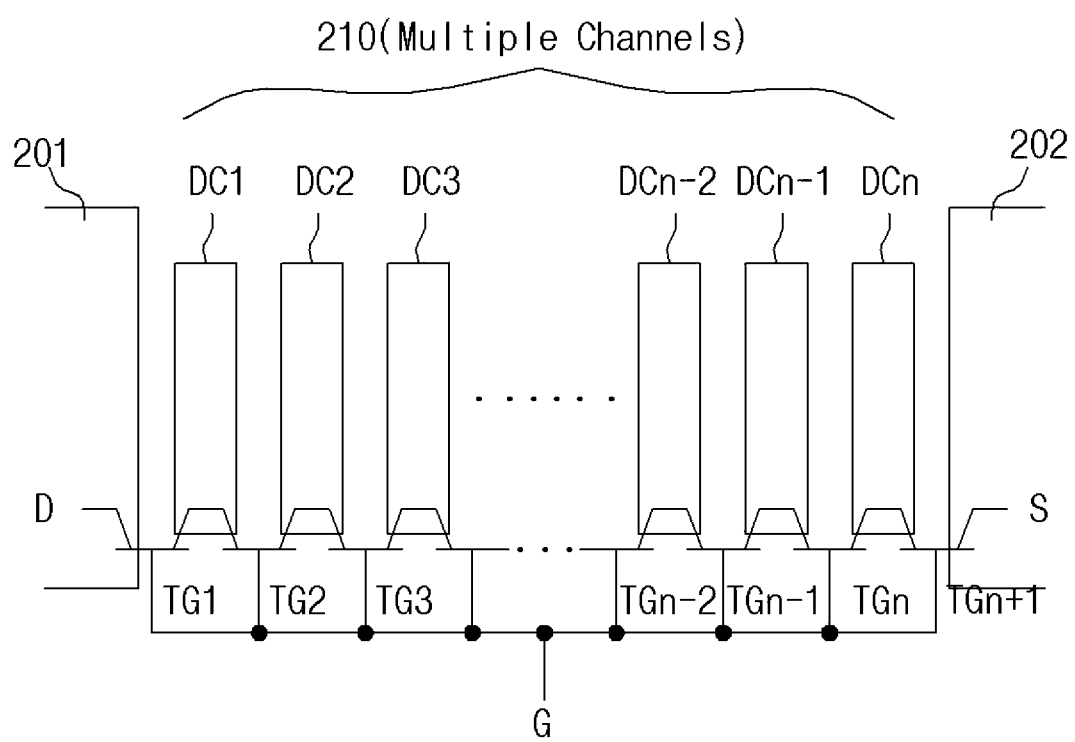
FIG. 10 is a partial enlarged top view of the diffusion current element of FIGS. 6 to 8 to which an equivalent circuit is applied.

Each channel of the diffusion electrodes 210 which form multiple channels generates, amplifies and transfers diffusion current corresponding to a potential barrier of the insulating layer 100. The generation, amplification and transfer of diffusion current per channel may be described below with reference to FIG. 10. FIG. 10 is a partial enlarged top view of the diffusion current element of FIGS. 6 to 8 to which an equivalent circuit is applied.

In FIG. 10, the multiple channels formed by the diffusion electrodes 210 include a channel between the first electrode 201 and the diffusion electrode DC1 closest thereto, channels between the diffusion electrodes DC1 to DCn and a channel between the second electrode 202 and the diffusion electrode DCn closest thereto. The control electrode 203 may act in common on the respective multiple channels through the insulating layer 100. An electrical signal which is provided to the control electrode 203 influences the generation, amplification and transfer of diffusion current, and as a result, may control the transfer characteristic of the diffusion current element.

Each channel between adjacent electrodes may be equivalently expressed as a unit diffusion current element which generates, amplifies and transfers diffusion current by an underlying insulating layer. Therefore, the multiple channels of the diffusion electrodes DC1 to DCn which are arranged in a line may be expressed as an equivalent circuit in which unit diffusion current elements T1 to Tn+1 are connected in series and control electrodes TG1 to TGn+1 are connected in common to the unit diffusion current elements T1 to Tn+1.

By the configuration illustrated in FIG. 10, diffusion current is generated in a direction opposite to drift current, due to a potential barrier of the insulating layer at the unit diffusion current elements T1 to Tn+1 of the respective channels. Diffusion current may be transferred while being amplified stepwise through the multiple channels of the diffusion electrodes 210.

An amplification degree of diffusion current per channel may be determined by a separation distance between electrodes and the characteristic of the insulating layer.

Figure 11:
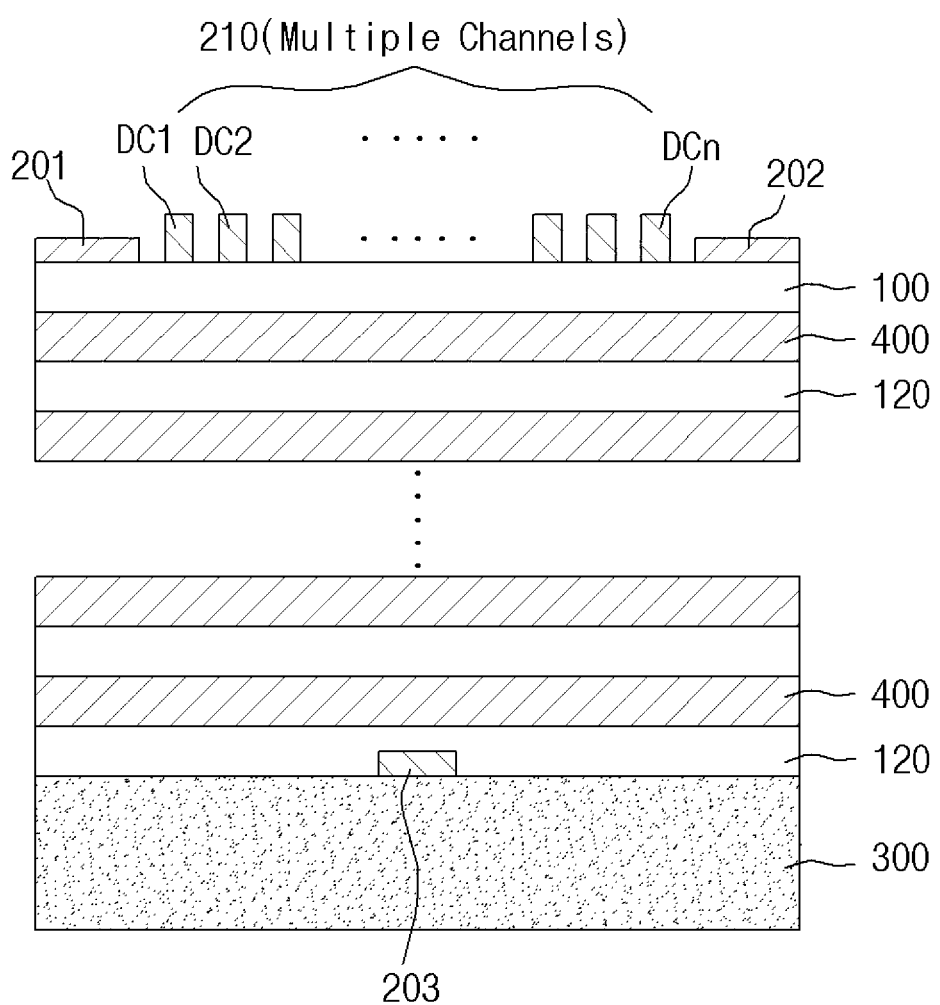
FIG. 11 is a cross-sectional view illustrating a modified embodiment of FIG. 6.
Figure 12:
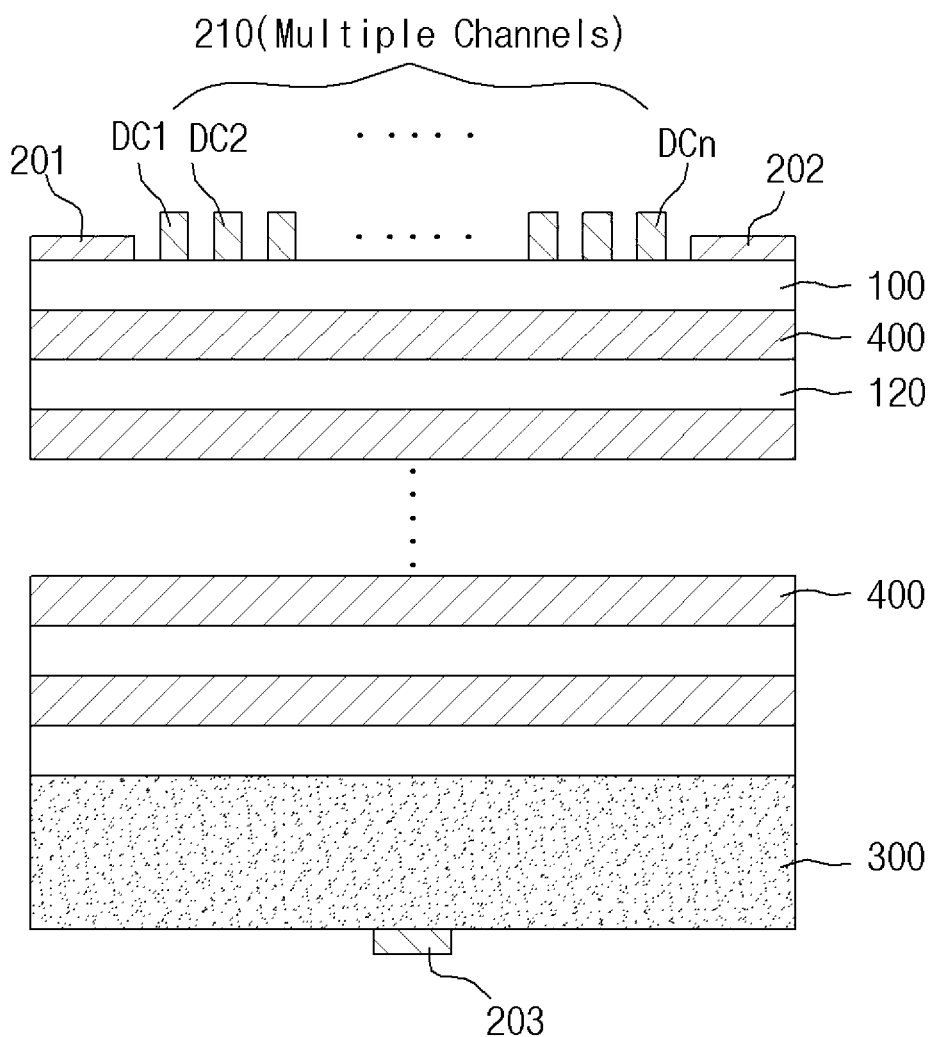
FIG. 12 is a cross-sectional view illustrating a modified embodiment of FIG. 7.
Figure 13:
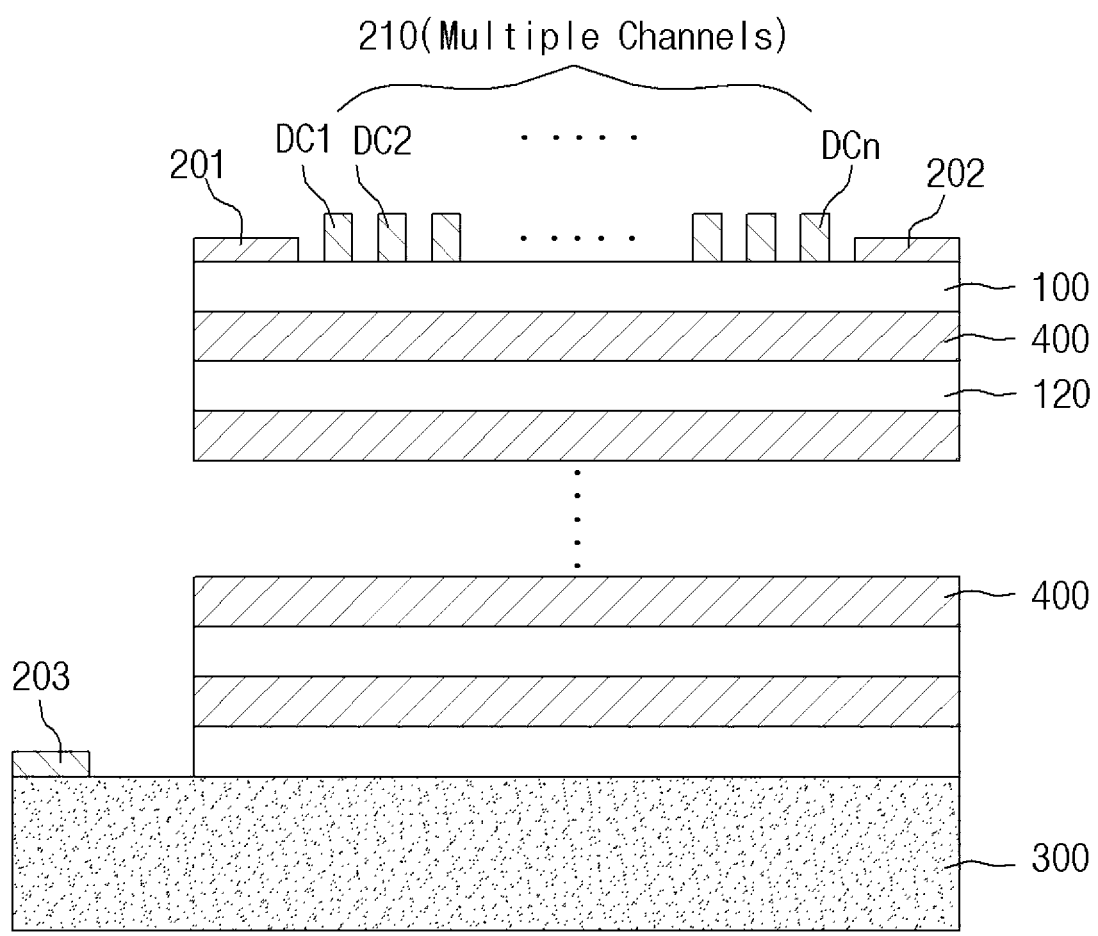
FIG. 13 is a cross-sectional view illustrating a modified embodiment of FIG. 8.

Meanwhile, the diffusion current element of the present disclosure illustrated in FIG. 6 may be embodied by being modified as illustrated in FIG. 11, the diffusion current element of the present disclosure illustrated in FIG. 7 may be embodied by being modified as illustrated in FIG. 12, and the diffusion current element of the present disclosure illustrated in FIG. 8 may be embodied by being modified as illustrated in FIG. 13.

In FIGS. 11 to 13, since the structure of the first electrode 201, the second electrode 202 and the diffusion electrodes 210 on the insulating layer 100 is the same as in the embodiments of FIGS. 6 to 8, repeated descriptions therefor will be omitted herein.

Referring to FIG. 11, in order to improve a diffusion current transfer characteristic, the diffusion current element may have a structure in which an interlayer conductive layer 400 and an interlayer insulating layer 120 are additionally stacked by one layer or a plurality of layers between the insulating layer 100 and the substrate 300. The interlayer conductive layer 400 may be formed under the insulating layer 100, and the interlayer insulating layer 120 may be formed under the interlayer conductive layer 400. The interlayer conductive layer 400 and the interlayer insulating layer 120 may be alternately stacked by at least one layer. The control electrode 203 is formed on the bottom surface of the interlayer insulating layer 120 positioned lowermost to extend into the interlayer insulating layer 120.

Referring to FIGS. 12 and 13, in order to improve a diffusion current transfer characteristic, the diffusion current element may have a structure in which an interlayer conductive layer 400 and an interlayer insulating layer 120 are additionally stacked by one layer or a plurality of layers between the insulating layer 100 and the substrate 300. The interlayer conductive layer 400 may be formed under the insulating layer 100, and the interlayer insulating layer 120 may be formed under the interlayer conductive layer 400. The interlayer conductive layer 400 and the interlayer insulating layer 120 may be alternately stacked by at least one layer. In the embodiment of FIG. 12, in the same manner as in FIG. 7, the control electrode 203 is illustrated as being formed on the bottom surface of the substrate 300 lying under the insulating layer 100. In the embodiment of FIG. 13, in the same manner as in FIG. 8, the control electrode 203 is illustrated as being formed on the insulating layer 100 at a position separated from the first electrode 201, the diffusion electrodes 210 and the second electrode 202.

A TTD of the present disclosure includes the diffusion current element which is embodied as illustrated in FIGS. 1 to 13, and has an effect in that leakage current may be prevented by using diffusion current due to a potential barrier by an insulating layer of the diffusion current element having bidirectionality.

Figure 14:
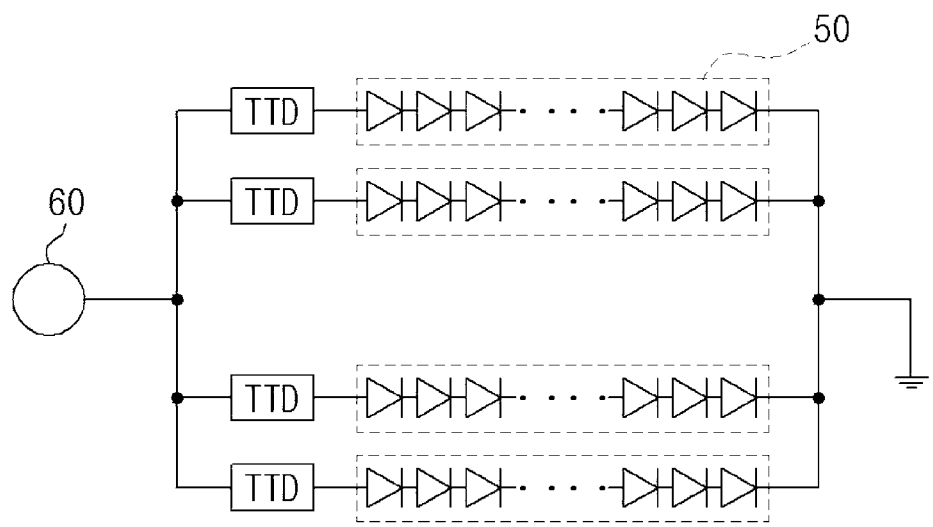
FIG. 14 is a circuit diagram illustrating a lighting device using a TTD in accordance with an embodiment of the present disclosure.

Meanwhile, the present disclosure may realize a lighting device which prevents leakage current by using the TTD described above. FIG. 14 is a circuit diagram illustrating a lighting device using a TTD, in accordance with an embodiment of the present disclosure.

The lighting device in accordance with the embodiment of the present disclosure may include TTDs, LED modules 50 and a power source 60.

The power source 60 supplies power to the LED modules 50 through the TTDs. The embodiment of FIG. 14 illustrates that a plurality of TTDs are connected in parallel to the power source 60. One LED module 50 and one TTD are connected in series, the LED modules 50 and the TTDs which are connected in series form a plurality of rows, and the power supply 60 supplies power to the respective rows.

Namely, the power source 60 has a power supply terminal and a ground terminal, the plurality of rows are connected in parallel between the power supply terminal and the ground terminal, the LED module 50 of each row emits light by power supplied through the TTD, and the TTD of each row prevents leakage current below a turn-on voltage of the LED module 50.

It may be understood that the power source 60 provides AC power.

The LED modules 50 of the respective rows may be configured to have the same turn-on voltage if possible. To this end, the respective LED modules 50 may be exemplified as including the same number of LEDs which have the same threshold voltage and are connected in series.

In the lighting device described above, leakage current may be defined as collectively referring to current generated by power supply of the power source 60 at a level lower than the turn-on voltage of the LED module 50.

The lighting device of the present disclosure embodied as illustrated in FIG. 14 may be described in detail by exemplifying the coupling of a TTD and LEDs which form a single path, that is, are arranged in a line.

The lighting device of the present disclosure may be embodied by using a TTD including a diffusion current element which does not have a control electrode or may be embodied by using a TTD including a diffusion current element which has a control electrode.

Figure 15:
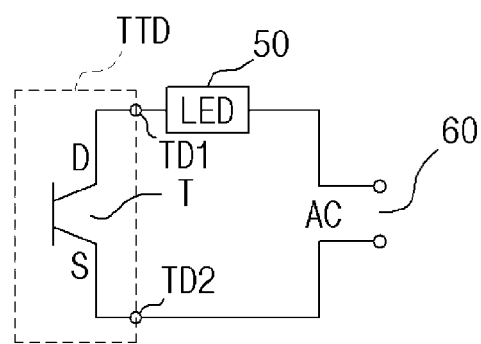
FIG. 15 is a circuit diagram illustrating a lighting device using a TTD in accordance with an embodiment of the present disclosure, as having a single path.

A diffusion current element which does not have a control electrode is described above with reference to FIGS. 1 to 4, and a lighting device using a TTD including the diffusion current element of FIGS. 1 to 4 may be exemplified as illustrated in FIG. 15.

The lighting device of FIG. 15 includes a TTD which has a first terminal TD1 and a second terminal TD2, an LED module 50 and a power source 60. The LED module 50 and the power source 60 are connected in series between the first terminal TD1 and the second terminal TD2.

The TTD includes the first terminal TD1, the second terminal TD2 and a diffusion current element T. The LED module 50 and the power source 60 are connected in series between the first terminal TD1 and the second terminal TD2 of the TTD. The power source 60 may be configured to provide AC power. The LED module 50 may include one LED or an LED string in which at least two LEDs are connected in series. The LED module 50 may emit light above a turn-on voltage and may be extinguished below the turn-on voltage.

The TTD is configured to have the first terminal TD1 to be connected with the LED module 50 and the second terminal TD2 to be connected with the power source 60.

The diffusion current element T of the TTD has a structure which does not have a control electrode, as described above with reference to FIGS. 1 to 4, and prevents the leakage current of the power source 60 from being provided to the LED module 50 in a state in which the LED module 50 is turned off, by generating, amplifying and transferring diffusion current due to a potential barrier by an insulating layer.

As described above with reference to FIGS. 1 to 4, the diffusion current element T includes the insulating layer 100, the first electrode 201 (D) which corresponds to the first terminal TD1 and is formed on the insulating layer 100, the second electrode 202 (S) which corresponds to the second terminal TD2 and is formed on the insulating layer 100 to be separated from the first electrode 201 (D), and the diffusion electrodes 210 which are separated from one another and are arranged in a line on the insulating layer 100 between the first electrode 201 (D) and the second electrode 202 (S) and form multiple channels for transferring diffusion current.

Since the configuration and working effects of the diffusion current element T described above may be understood by the descriptions made above with reference to FIGS. 1 to 4, repeated descriptions therefor will be omitted herein.

The diffusion current element included in the TTD of the embodiment illustrated in FIG. 15 may be embodied to include the interlayer conductive layer 400 and the interlayer insulating layer 120 in a multi-layered structure as illustrated in FIG. 5.

The lighting device of the present disclosure may be embodied by using a TTD including a diffusion current element which does not have a control electrode or may be embodied by using a TTD including a diffusion current element which has a control electrode.

Figure 16:
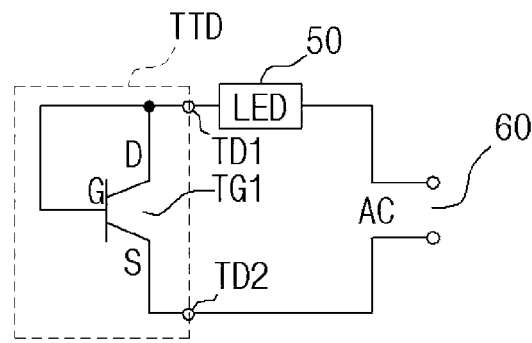
FIGS. 16 to 23 are circuit diagrams illustrating lighting devices using TTDs in accordance with other embodiments of the present disclosure.
Figure 17:
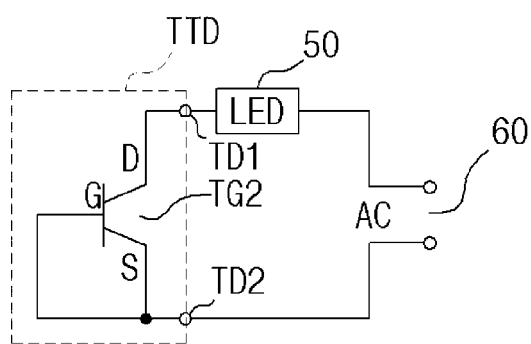
Figure 18:
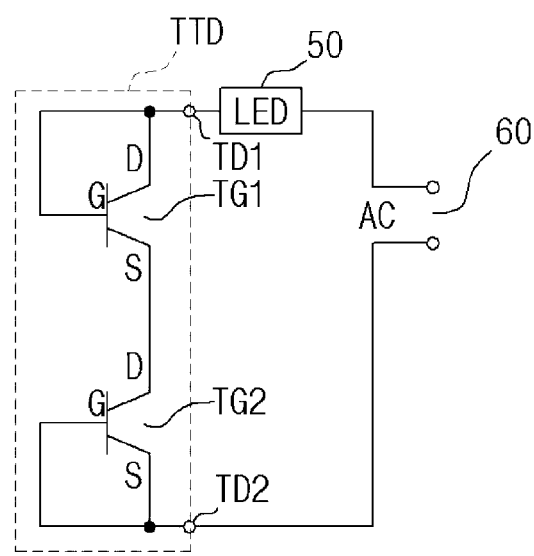

A diffusion current element which has a control electrode is described above with reference to FIGS. 6 to 10, and a lighting device using a TTD including the diffusion current element of FIGS. 6 to 10 may be exemplified as illustrated in FIGS. 16 to 18.

First, in the same manner as in FIG. 15, embodiments of lighting devices of FIGS. 16 to 18 each includes a TTD which has a first terminal TD1 and a second terminal TD2, an LED module 50 and a power source 60. The LED module 50 and the power source 60 are connected in series between the first terminal TD1 and the second terminal TD2.

The TTD includes the first terminal TD1, the second terminal TD2 and a diffusion current element TG. The LED module 50 and the power source 60 are connected in series between the first terminal TD1 and the second terminal TD2 of the TTD.

In the embodiments of the lighting devices of FIGS. 16 to 18, the TTD may include the diffusion current element TG which has the control electrode of any one of FIGS. 6 to 8, and prevents leakage current of the power source 60 from being provided to the LED module 50 in a state in which the LED module 50 is turned off, by generating, amplifying and transferring diffusion current due to a potential barrier by an insulating layer.

The diffusion current element includes an insulating layer 100, a first electrode 201 (D) which corresponds to the first terminal TD1 and is formed on the insulating layer 100, a second electrode 202 (S) which corresponds to the second terminal TD2 and is formed on the insulating layer 100 to be separated from the first electrode 201 (D), diffusion electrodes 210 which are separated from one another and are arranged in a line on the insulating layer 100 between the first electrode 201 (D) and the second electrode 202 (S) and form multiple channels for transferring diffusion current, and a control electrode 203 (G) which is formed with respect to the insulating layer 100. The control electrode 203 (G) may be electrically connected to at least one of the first electrode 201 (D) and the second electrode 202 (S), for current control. The diffusion current element is referred to as a first diffusion current element TG1 in the case where the control electrode 203 (G) is electrically connected with the first electrode 201 (D), and is referred to as a second diffusion current element TG2 in the case where the control electrode 203 (G) is electrically connected with the second electrode 202 (S).

In detail, the embodiment of FIG. 16 illustrates that the first diffusion current element TG1 in which the control electrode 203 (G) is electrically connected with the first electrode 201 (D) is included in a TTD, the embodiment of FIG. 17 illustrates that the second diffusion current element TG2 in which the control electrode 203 (G) is electrically connected with the second electrode 202 (S) is included in a TTD, and the embodiment of FIG. 18 illustrates that the first diffusion current element TG1 and the second diffusion current element TG2 which are connected in series are included in a TTD.

Since the configurations and working effects of the first and second diffusion current elements TG1 and TG2 described above may be understood by the descriptions made above with reference to FIGS. 6 to 8, repeated descriptions therefor will be omitted herein.

The first and second diffusion current elements TG1 and TG2 which are included in the TTDs of the embodiments illustrated in FIGS. 16 to 18 may be embodied to include the interlayer conductive layer 400 and the interlayer insulating layer 120 in a multi-layered structure as illustrated in FIGS. 11 to 13.

In the above-described embodiments of FIGS. 16 to 18, diffusion current between the first electrode 201 (D) and the second electrode 202 (S) of the first and second diffusion current elements TG1 and TG2 depends on an electrical signal which is provided to the control electrode 203 (G).

In the case of FIG. 16, the control electrode 203 (G) in the first diffusion current element TG1 is electrically connected to one end of the LED module 50 in common with the first electrode 201 (D).

In FIG. 16, if a positive (+) voltage of the first electrode 201 (D) of the first diffusion current element TG1 is provided to the control electrode 203 (G), the depletion effect of the insulating layer 100 increases as a potential barrier increases. A potential barrier provided to the LED module 50 is high because the electric potential difference of the insulating layer 100 of the first diffusion current element TG1 increases negatively. Therefore, the first diffusion current element TG1 may generate high diffusion current, and accordingly, the luminous intensity of the LED module 50 may increase. As a result, the LED module 50 may emit light with improved luminous intensity without heat generation by diffusion current of high efficiency.

In the case of FIG. 17, the control electrode 203 (G) in the second diffusion current element TG2 is electrically connected to one end of the power source 60 in common with the second electrode 202 (S).

When compared to FIG. 16, the second diffusion current element TG2 of FIG. 17 has the same configuration as the first diffusion current element TG1 of FIG. 16 except that the control electrode 203 (G) is connected to the second electrode 202 (S) instead of the first electrode 201 (D). Thus, since the working effects of the second diffusion current element TG2 of FIG. 17 may be understood by the working effects of the first diffusion current element TG1 of FIG. 16, detailed descriptions thereof will be omitted herein.

In the case of FIG. 18, the control electrode 203 (G) in the first diffusion current element TG1 is electrically connected to one end of the LED module 50 in common with the first electrode 201 (D), and the control electrode 203 (G) in the second diffusion current element TG2 is electrically connected to one end of the power source 60 in common with the second electrode 202 (S).

FIG. 18 illustrates a configuration in which the embodiment of FIG. 16 and the embodiment of FIG. 17 are combined. Thus, since the working effects of the TTD of FIG. 18 may be understood by the working effects of the first diffusion current element TG1 of FIG. 16 and the second diffusion current element TG2 of FIG. 17, detailed descriptions thereof will be omitted herein. In particular, when AC power is supplied from the power source 60, the LED module 50 of the lighting device may generate a flicker. In order to solve this, in the present disclosure, the first and second diffusion current elements TG1 and TG2 may be designed to be symmetrical to each other, as illustrated in FIG. 18, to alleviate the generation of a flicker.

The control electrode 203 (G) of the diffusion current element may be electrically connected through a resistor to at least one of the first electrode 201 (D) and the second electrode 202 (S), for current control. Embodiments for this may be illustrated in FIGS. 19 to 21.

Figure 19:
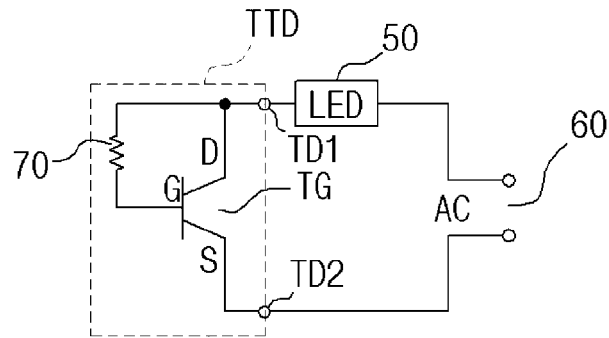

FIG. 19 is a circuit diagram illustrating that, in the embodiment of FIG. 16, a resistor 70 is additionally configured in the control electrode 203 (G) of the first diffusion current element TG1. In the embodiment of FIG. 19, diffusion current between the first electrode 201 (D) and the second electrode 202 (S) of the first diffusion current element TG1 is influenced by a voltage of the control electrode 203 (G) and the resistor 70.

That is to say, an amount of diffusion current between the first electrode 201 (D) and the second electrode 202 (S) of the first diffusion current element TG1 may be controlled by an electrical signal which is provided to the control electrode 203 (G). For this reason, the resistor 70 may be configured in the control electrode 203 (G), and a negative voltage of the control electrode 203 (G) may be reduced much more by the resistor 70. As a result, by the control of the control electrode 203 (G) using the resistor 70, a tunneling effect through the insulating layer 100 between the first electrode 201 (D) and the second electrode 202 (S) may be controlled.

Figure 20:
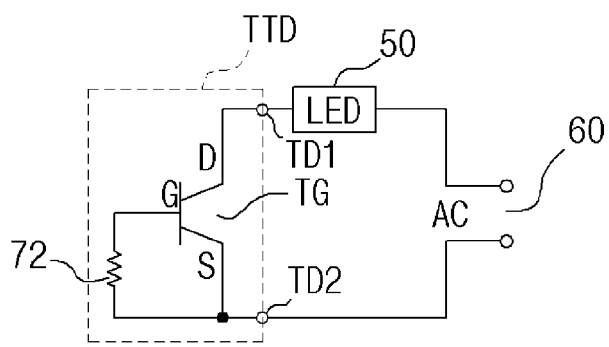

FIG. 20 is a circuit diagram illustrating that, in the embodiment of FIG. 17, a resistor 72 is additionally configured in the control electrode 203 (G) of the second diffusion current element TG2. Even in the embodiment of FIG. 20, in the same manner as in FIG. 19, an amount of diffusion current between the first electrode 201 (D) and the second electrode 202 (S) of the second diffusion current element TG2 may be controlled by an electrical signal which is provided to the control electrode 203 (G), and as a result, by the control of the control electrode 203 (G) using the resistor 72, a tunneling effect through the insulating layer 100 between the first electrode 201 (D) and the second electrode 202 (S) may be controlled.

Figure 21:
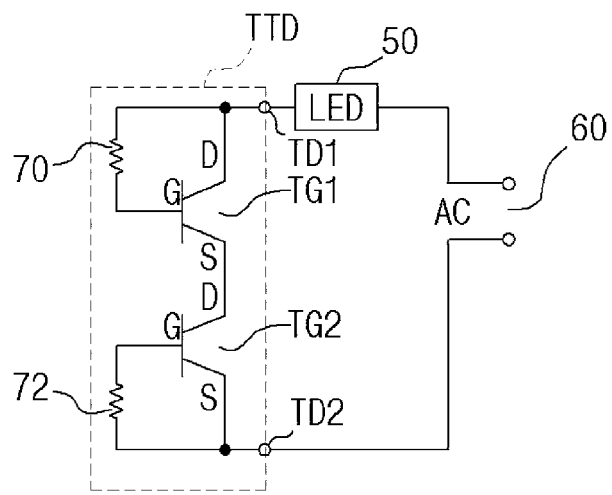

FIG. 21 illustrates a configuration in which the embodiment of FIG. 19 and the embodiment of FIG. 20 are combined. Thus, since the working effects of FIG. 21 may be understood by referring to FIGS. 19 and 20, repeated descriptions thereof will be omitted herein.

Figure 22:
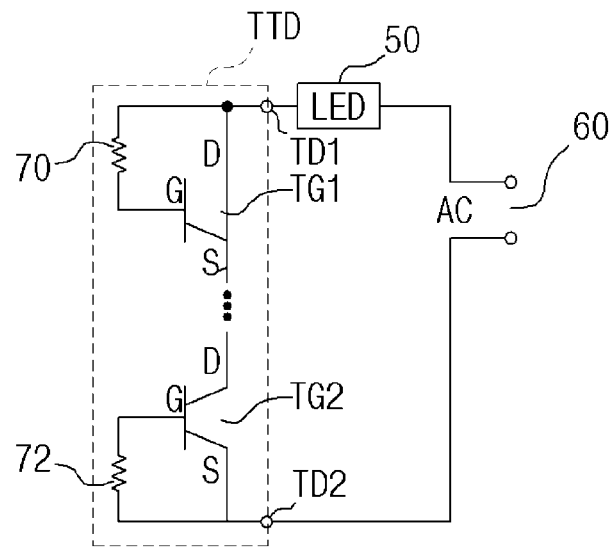
Figure 23:
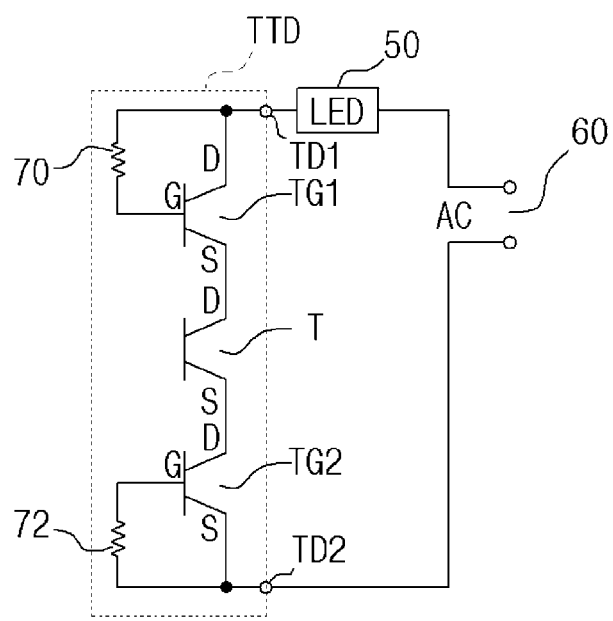

A TTD used in the lighting device of the present disclosure may be embodied as illustrated in FIGS. 22 and 23 to have a symmetrical structure for flicker alleviation.

FIG. 22 illustrates a TTD in which the same number of first diffusion current elements TG1 and second diffusion current elements TG2 are additionally provided between a first diffusion current element TG1 and a second diffusion current element TG2.

FIG. 23 illustrates a TTD in which the diffusion current element T of FIG. 15 is configured between a first diffusion current element TG1 and a second diffusion current element TG2. In the TTD, the first diffusion current element TG1 and the second diffusion current element TG2 are symmetrically configured with respect to the diffusion current element T.

As is apparent from the above descriptions, the lighting device according to the embodiments of the present disclosure may solve problems caused due to leakage current accompanied by the driving of an LED module, by using a TTD. In particular, the lighting device according to the embodiments of the present disclosure may prevent heat generation in the lighting device, by preventing leakage current in the TTD.

Meanwhile, the lighting device of the present disclosure may be embodied to be used as a power source 60 which provides high AC power.

Figure 24:
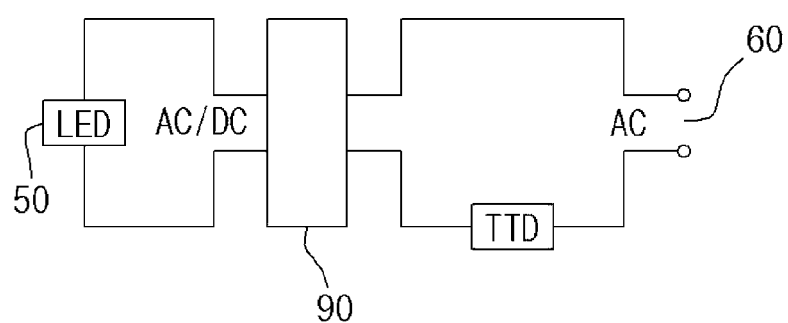
FIG. 24 is a circuit diagram illustrating a case where a lighting device in accordance with an embodiment of the present disclosure uses high power.

In this case, the lighting device of the present disclosure may also include a power conversion device 90 as illustrated in FIG. 24.

The power conversion device 90 may be configured to convert first power inputted to a first input terminal and a second input terminal of the power source 60 into second power and provide the second power to an LED module 50 through a first output terminal and a second output terminal.

In the power conversion device 90, the first input terminal may be connected to one end of the power source 60, and the second input terminal may be connected with one of a first terminal and a second terminal of a TTD.

By the above configuration, the TTD prevents leakage current of the power of the power source 60 inputted to the power conversion device 90 to provide the second power to the LED module 50.

The configuration of FIG. 24 is designed in consideration of the fact that the LED module 50 is generally configured as one set with the power conversion device 90. The lighting device of the present disclosure is embodied to configure a TTD for power supplied to a power conversion device as illustrated in FIG. 24. Therefore, the lighting device of the present disclosure may prevent leakage current of AC power supplied from the power source 60 without a design change of the LED module 50 and the power conversion device 90 configured as a set, and may secure reliability by controlling heat generation at a TTD level.

As the power conversion device 90 configured in FIG. 24, a switching mode power supply (SMPS) used as an AC-AC converter or an AC-DC converter may be exemplified.

Further, in the case where the lighting device of the present disclosure is configured to drive the LED module 50 by high power, a TTD may act as a load and may generate heat to a high temperature.

Figure 25:
FIG. 25 is a side view illustrating a TTD for heat dissipation in accordance with an embodiment of the present disclosure.

In order to solve the heat generation of the TTD, the TTD may be configured to be coupled with a heat dissipation plate 95 as illustrated in FIG. 25. In this case, the heat dissipation plate 95 may be configured to be coupled to one surface of a substrate on which an insulating layer for configuring a diffusion current element of the TTD is formed. The heat dissipation plate 95 may be configured by a substrate which is formed of a metallic material having excellent heat dissipation efficiency, or may be configured by a substrate which has heat dissipation patterns formed of a metallic material having excellent heat dissipation efficiency.

The heat dissipation plate 95 of FIG. 25 may be configured to be separated from a substrate for the assembly of the LED module 50 and the power conversion device 90.

In the lighting device of the present disclosure, when the TTD generates heat to a high temperature as the LED module 50 is driven by high power, the heat of the TTD may be dissipated by using the heat dissipation plate 95. Therefore, the lighting device may secure reliability for the heat dissipation of the TTD in the case of high power.

The invention claimed is:

1. A two-terminal device comprising:
   a first terminal;
   a second terminal; and
   a diffusion current element including an insulating layer, and configured to prevent generation of leakage current by generating diffusion current due to a potential barrier of the insulating layer depending on voltage environment between the first terminal and the second terminal,
   the diffusion current element comprising
   the insulating layer;
   a first electrode corresponding to the first terminal, and formed on the insulating layer;
   a second electrode corresponding to the second terminal, and formed on the insulating layer to be separated from the first electrode;
   diffusion electrodes separated from one another and arranged in a line on the insulating layer between the first electrode and the second electrode, and configured to form multiple channels for transferring the diffusion current; and
   a control electrode formed with respect to the insulating layer,
   wherein the control electrode is electrically connected to at least one of the first electrode and the second electrode, and
   wherein each of the multiple channels amplifies the diffusion current having directionality depending on the voltage environment.

2. The two-terminal device according to claim 1, wherein the control electrode is formed on a bottom surface of the insulating layer to extend into the insulating layer.

3. The two-terminal device according to claim 1,
   wherein an interlayer conductive layer and an interlayer insulating layer lying under the interlayer conductive layer are additionally stacked by one layer or a plurality of layers under the insulating layer, and
   wherein the control electrode is formed on a bottom surface of the interlayer insulating layer positioned lowermost to extend into the interlayer insulating layer.

4. The two-terminal device according to claim 1, wherein the control electrode is formed on a bottom surface of a substrate lying under the insulating layer.

5. The two-terminal device according to claim 1, wherein the control electrode is formed on the insulating layer at a position separated from the first electrode, the diffusion electrodes and the second electrode.

6. The two-terminal device according to claim 1, wherein an interlayer conductive layer and an interlayer insulating layer lying under the interlayer conductive layer are additionally stacked by one layer or a plurality of layers under the insulating layer.

7. The two-terminal device according to claim 1, wherein the two-terminal device is coupled with a heat dissipation plate which is bonded to one surface of a substrate on which the insulating layer is formed, and the heat dissipation plate is formed of a metallic material.

8. A lighting device comprising:
   a two-terminal device having a first terminal and a second terminal;

an LED module; and a power source, wherein the LED module and the power source are connected in series between the first terminal and the second terminal, wherein the two-terminal device comprises:

the first terminal;

the second terminal; and a diffusion current element including an insulating layer, and configured to prevent generation of leakage current by generating diffusion current due to a potential barrier of the insulating layer depending on voltage environment between the first terminal and the second terminal, wherein the diffusion current element comprises:

the insulating layer;

a first electrode corresponding to the first terminal, and formed on the insulating layer;

a second electrode corresponding to the second terminal, and formed on the insulating layer to be separated from the first electrode;

diffusion electrodes separated from one another and arranged in a line on the insulating layer between the first electrode and the second electrode, and configured to form multiple channels for transferring the diffusion current; and a control electrode formed with respect to the insulating layer, wherein the control electrode is electrically connected to at least one of the first electrode and the second electrode, and wherein each of the multiple channels amplifies the diffusion current having directionality depending on the voltage environment.

9. The lighting device according to claim 8, wherein the control electrode is formed on a bottom surface of the insulating layer to extend into the insulating layer.

10. The lighting device according to claim 8, wherein an interlayer conductive layer and an interlayer insulating layer lying under the interlayer conductive layer are additionally stacked by one layer or a plurality of layers under the insulating layer, and wherein the control electrode is formed on a bottom surface of the interlayer insulating layer positioned lowermost to extend into the interlayer insulating layer.

11. The lighting device according to claim 8, wherein the control electrode is formed on a bottom surface of a substrate lying under the insulating layer.

12. The lighting device according to claim 8, wherein the control electrode is formed on the insulating layer at a position separated from the first electrode, the diffusion electrodes and the second electrode.

13. The lighting device according to claim 8, wherein an interlayer conductive layer and an interlayer insulating layer lying under the interlayer conductive layer are additionally stacked by one layer or a plurality of layers under the insulating layer.

14. The lighting device according to claim 8, wherein the control electrode and the first electrode are connected in common to one end of the LED module.

15. The lighting device according to claim 14, wherein the control electrode is electrically connected to the first electrode through a first resistor for current control.

16. The lighting device according to claim 8, wherein the control electrode and the second electrode are connected in common to one end of the power source.

17. The lighting device according to claim 16, wherein the control electrode is electrically connected to the second electrode through a second resistor for current control.

18. The lighting device according to claim 8, further comprising:

a power conversion device configured to convert first power inputted to a first input terminal and a second input terminal of the power source into second power, and provide the second power to the LED module through a first output terminal and a second output terminal, wherein the first input terminal of the power conversion device is connected to one end of the power source, and the second input terminal is connected with one of the first terminal and the second terminal of the two-terminal device.

19. The lighting device according to claim 8, wherein the two-terminal device is coupled with a heat dissipation plate which is bonded to one surface of the substrate on which the insulating layer is formed, and the heat dissipation plate is formed of a metallic material.

* * * * *